(12) United States Patent
Gunn

(10) Patent No.: US 10,848,176 B1
(45) Date of Patent: *Nov. 24, 2020

(54) DIGITAL DELTA-SIGMA MODULATOR WITH NON-RECURSIVE COMPUTATION OF RESIDUES

(71) Applicant: RAYTHEON COMPANY, Waltham, MA (US)

(72) Inventor: Brian A. Gunn, Goleta, CA (US)

(73) Assignee: Raytheon Company, Waltham, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/590,221

(22) Filed: Oct. 1, 2019

(51) Int. Cl.
*H03M 3/00* (2006.01)

(52) U.S. Cl.
CPC ................... *H03M 3/508* (2013.01)

(58) Field of Classification Search
CPC ...................................... H03M 3/508
USPC .................................. 341/118–144
See application file for complete search history.

(56) References Cited

U.S. PATENT DOCUMENTS

| | | | | |
|---|---|---|---|---|
| 5,977,899 A * | 11/1999 | Adams | ..................... | H03M 3/50 341/143 |
| 6,304,608 B1 * | 10/2001 | Chen | ....................... | H03M 3/35 341/143 |
| 6,594,309 B1 * | 7/2003 | Botti | ....................... | H03F 3/217 336/10 |
| 7,840,015 B1 * | 11/2010 | Melanson | ................. | H03F 1/52 330/10 |
| 9,276,602 B1 * | 3/2016 | Pagnanelli | ............ | H03M 3/358 |
| 2001/0035835 A1 * | 11/2001 | Riley | ................... | H03M 7/3022 341/143 |
| 2002/0159417 A1 * | 10/2002 | Panasik | .................... | H03M 3/50 370/337 |
| 2002/0171571 A1 * | 11/2002 | Panasik | ................... | H03M 3/50 341/141 |
| 2008/0192876 A1 * | 8/2008 | Dulger | ................... | H03L 7/1806 375/376 |
| 2010/0103013 A1 * | 4/2010 | Deval | ..................... | H03M 3/33 341/143 |
| 2012/0081105 A1 * | 4/2012 | Hammerschmidt | .... | G06F 1/025 324/76.19 |
| 2015/0145567 A1 * | 5/2015 | Perrott | .................. | G04F 10/005 327/156 |
| 2017/0134055 A1 * | 5/2017 | Ebrahimi | ............. | H04B 1/0475 |
| 2019/0165820 A1 * | 5/2019 | Xu | .......................... | H03M 3/47 |
| 2020/0083900 A1 * | 3/2020 | Shabra | .................. | H03M 3/414 |

* cited by examiner

*Primary Examiner* — Lam T Mai
(74) *Attorney, Agent, or Firm* — Lewis Roca Rothgerber Christie LLP

(57) ABSTRACT

A delta-sigma modulator (DSM) with non-recursive computation of delta-sigma residues comprising: an input port for receiving a digital input signal; a residue calculation circuit coupled to the input port for calculating delta-sigma residues non-recursively; and a DSM output calculation circuit coupled to the output of the residue calculation circuit for generating an output of the DSM.

18 Claims, 9 Drawing Sheets

DIGITAL DELTA-SIGMA MODULATOR WITH NON-RECURSIVE COMPUTATION OF RESIDUES

FIELD OF THE INVENTION

The disclosed invention relates generally to signal generation and more specifically to a digital delta-sigma modulator with non-recursive (direct) computation of residues.

BACKGROUND

In the last few decades, digital systems have progressed from scarce to ubiquitous, in many cases out-performing tasks traditionally accomplished using analog systems. Over the same time period, the capability of those digital systems have dramatically increased, also with a significant reduction in size, weight, power, and cost (SWAP-C). Digital systems and signals differ from their analog counterparts primarily because they are quantized (discrete in value) and sampled (discrete in time). Analog-to-digital converters (ADCs) sample and quantize an analog signal to create a digital signal, a process known as digitization. Conversely, digital-to-analog converters (DACs) generate analog signals from digital signals. ADCs and DACs are often at the boundary of a digital system, determining much of the system's performance in its interaction with the environment.

Both ADCs and DACs are governed by the Nyquist Sampling Criterion, which specifies the bandwidth of a digital signal to be no greater than the Nyquist bandwidth, which is half the sampling rate for a real signal with uniform sampling. If the Nyquist Criterion is satisfied, an analog signal can be digitized and then perfectly reconstructed using the digital samples. If the Nyquist criterion is violated, irreversible corruption may occur due to aliasing. In practice, signal bandwidths are typically noticeably less than the Nyquist bandwidth.

For an ADC to satisfy the Nyquist Sampling Criterion, the analog signal must be filtered to a bandwidth less than the Nyquist bandwidth of the converter before digitization. For a DAC, analog filtering is generally performed to reduce spectral artifacts outside the Nyquist bandwidth of the represented signal. Examples of ADC applications include the receive path of digital coherent radar, communications, networking, electronic warfare, and control circuitry. DACs might be used on the transmit side for each of those applications.

Nyquist-rate ADCs and DACs are a class of converters whose converted signal typically has a bandwidth comparable to the Nyquist bandwidth. These converters generally have more bits and therefore more levels of quantization compared to alternative classes of converters.

Delta-sigma converters are in a separate class of converters. In contrast to Nyquist-rate converters, delta-sigma converters are oversampled converters, meaning their Nyquist bandwidth is much greater than the signal bandwidth. The specific ratio at which a delta-sigma DAC samples compared to the Nyquist rate is specified as the converter's oversampling ratio (OSR).

Specific instances of delta-sigma converters may have comparable performance to Nyquist-sampled converters, with reduced size, weight, power, and/or cost. Delta-sigma converters typically are highly quantized (fewer bits), but can retain the signal quality over the signal bandwidth through oversampling and spectral shaping of the quantization noise away from the signal. This shaping occurs through a feedback loop. The quantization error of previous samples are used to adjust the value of subsequent pre-quantization samples. Higher OSRs improve the noise shaping (OSR is often more than 10). Delta-sigma ADCs differ fundamentally from delta-sigma DACs in that the delta-sigma ADC's feedback loop is mixed signal (analog and digital), whereas the delta-sigma DAC feedback is purely digital.

Typically, a delta-sigma DAC comprises an input, a quantizer, an output, and a feedback path. The feedback path uses the difference (a.k.a. residue or error) between the pre-quantized signal and its quantized approximation. The specific feedback logic determines the characteristics of the noise shaping (e.g. the order N and the coefficient values $\{c_1, c_2, c_3, \ldots c_N\}$). Note that the quantized approximation may be represented in the output signal as binary (e.g. a binary 1 or binary 0 for a 1-bit output), the representation of which is scaled (e.g. multiplied by some gain) and offset (e.g. to a set 0-mean) before differencing.

Output sample rate directly impacts delta-sigma DAC performance; increasing the output sample rate increases either the operational signal bandwidth or the output's dynamic range. An increase in output sample rate with a constant signal bandwidth increases the OSR and thereby the SNR. An increase in output sample rate with constant OSR increases the operable bandwidth. The theoretical dynamic range performance of the first-order delta-sigma DAC is limited by the signal-to-noise ratio (SNR, in dB):

$$\text{SNR} < 9.03 \log_2(\text{OSR}) - 12.12 \tag{1}$$

Delta-sigma DACs are typically modeled and implemented recursively. A system or processes is recursive when the current state is determined using a previous state.

FIG. 1 is a simplified block diagram of a fully recursive 1-bit low-pass delta-sigma DAC 100, as is known in the art. As shown, a multi-bit oversampled signal 102 is input to the delta-sigma DAC 100. The input signal 102 is combined with a residue (error) signal 122 by an addition circuit 104 to produce an error-compensated signal 105. Signal 105 is quantized to 1 bit using a compare-to-zero comparator 106 to generate a modulated output signal 108. Signal 108 is then output from the delta-sigma DAC 100. Signal 108 is also fed back to a switch 116. The switch 116 interprets the encoding of the output signal 108 to the appropriate scale and offset relative to the error-compensated signal 105. For the 1-bit low-pass DSM shown, switch 116 takes a gain of the DSM (g) as its input and outputs the value of g 112 (same as its input) when signal 108 has a value of "1" and a value of negative g when signal 108 has a value of "0". The output of the switch 116 is combined with the error-compensated signal 105 by an subtraction circuit 118 to produce a 0-delay residue 119. The residue 122 is delayed by one clock cycle relative to the 0-delay residue 119 by a delay block 120.

The delta-sigma modulator in FIG. 1 can be modeled mathematically as $$y[n] = x_{int}[n] + \varepsilon[n-1] \tag{2}$$

$$x_b[n] = \begin{cases} 1, & y[n] > 0 \\ 0, & \text{otherwise} \end{cases} \tag{3}$$

$$\varepsilon[n] = y[n] + \begin{cases} -g, & y[n] > 0 \\ g, & \text{otherwise} \end{cases} \tag{4a}$$

$$= y[n] + \begin{cases} -g, & x_b[n] = 1 \\ g, & x_b[n] = 0 \end{cases} \tag{4b}$$

$$= y[n] + g + \begin{cases} -2g, & x_b[n] = 1 \\ 0, & x_b[n] = 0 \end{cases} \quad (4c)$$

$$= y[n] + g - 2g x_b[n] \quad (4d)$$

where n is time index $x_{int}[n]$ is oversampled signal 102 y[n] is error-compensated signal 105

$x_b$ [n] is output signal 108

ε[n] is 0-delay residue 119

ε[n−1] is residue 122 g is value for feedback gain 112

Delta-sigma DAC 100 is fully recursive since each signal (excluding the input signal 102) is expressed in terms dependent on some value of a previous clock cycle.

A recursive implementation's output data rate is limited to the rate at which the (loop) computation can be completed. In other words, a fully-recursive delta-sigma DAC has a maximum output data rate equal to the logic clock. This, in turn, limits the delta-sigma DAC's performance. Prior art approaches attempt to parallelize and pipeline the delta-sigma DAC to achieve higher performance, but all introduce non-idealities which produce spectral artifacts or other degradation in the quality of the output signal.

A higher delta-sigma DAC output rate may be achieved while preserving signal quality by pre-computing the output waveform. The computation is performed at slower rate than the rate of the output transmission. The a-priori waveform is stored in memory, and recalled when transmission is desired, potentially at a much higher rate than the logic which generated it. The use of this approach is greatly limited and impractical for many applications, because it assumes a priori knowledge of the desired waveform. Accordingly, there is a need for a high-performance real-time delta-sigma DAC which overcomes these limitations.

SUMMARY

In some embodiments, the disclosed invention is a digital delta-sigma modulator (DSM) with non-recursive computation of delta-sigma residues comprising: an input port for receiving a digital input signal; a residue calculation circuit coupled to the input port for calculating delta-sigma residues non-recursively; and a DSM output calculation circuit coupled to the output of the residue calculation circuit for generating an output of the DSM.

In some embodiments, the disclosed invention is a method for non-recursive computation of delta-sigma residues. The method includes: receiving a digital input signal; calculating delta-sigma residues non-recursively; and generating an output of the DSM.

In some embodiments, the disclosed invention is a digital-to-analog converter (DAC) comprising a digital delta-sigma modulator (DSM) with non-recursive computation of delta-sigma residues. The DSM includes: an input port for receiving a digital input signal; a residue calculation circuit coupled to the input port for calculating delta-sigma residues non-recursively; and a DSM output calculation circuit coupled to the output of the residue calculation circuit for generating an output of the DSM.

In some embodiments, the residue calculation circuit includes an accumulation filter coupled to the input port for accumulating the digital input signal, a modulo operator coupled to the accumulator, and a subtracting circuit for subtracting a DSM gain from predetermined samples of an output of modulo operator to generate a non-recursive delta-sigma residue output. In some embodiments, the accumulation filter includes an interpolator and a digital mixer to interpolate and mix the digital input signal to a desired output sample rate and frequency. In some embodiments, the accumulation filter is a poly-phase accumulator, the predetermined number of phases relating to the desired signal output frequency.

In some embodiments, the output calculation circuit generates the output of the DSM using a comparison of DSM residue samples over time. In some embodiments, the delta-sigma residues and DSM output are parallelized per a predetermined number of delta-sigma residue values provided in each clock cycle of the DSM.

BRIEF DESCRIPTION OF THE DRAWINGS

These and other features, aspects, and advantages of the disclosed invention will become better understood with regard to the following description, appended claims, and accompanying drawings.

DETAILED DESCRIPTION

A key enabling technology of the disclosed invention is the direct (non-recursive) computation of delta-sigma modulator (DSM) residues. This enables increased output DSM sample rates through parallelization and pipelining relative to a fully-recursive DSM. The increased output sample rate enables higher performance from the DSM, which is useful in a variety of applications.

Figure 2:
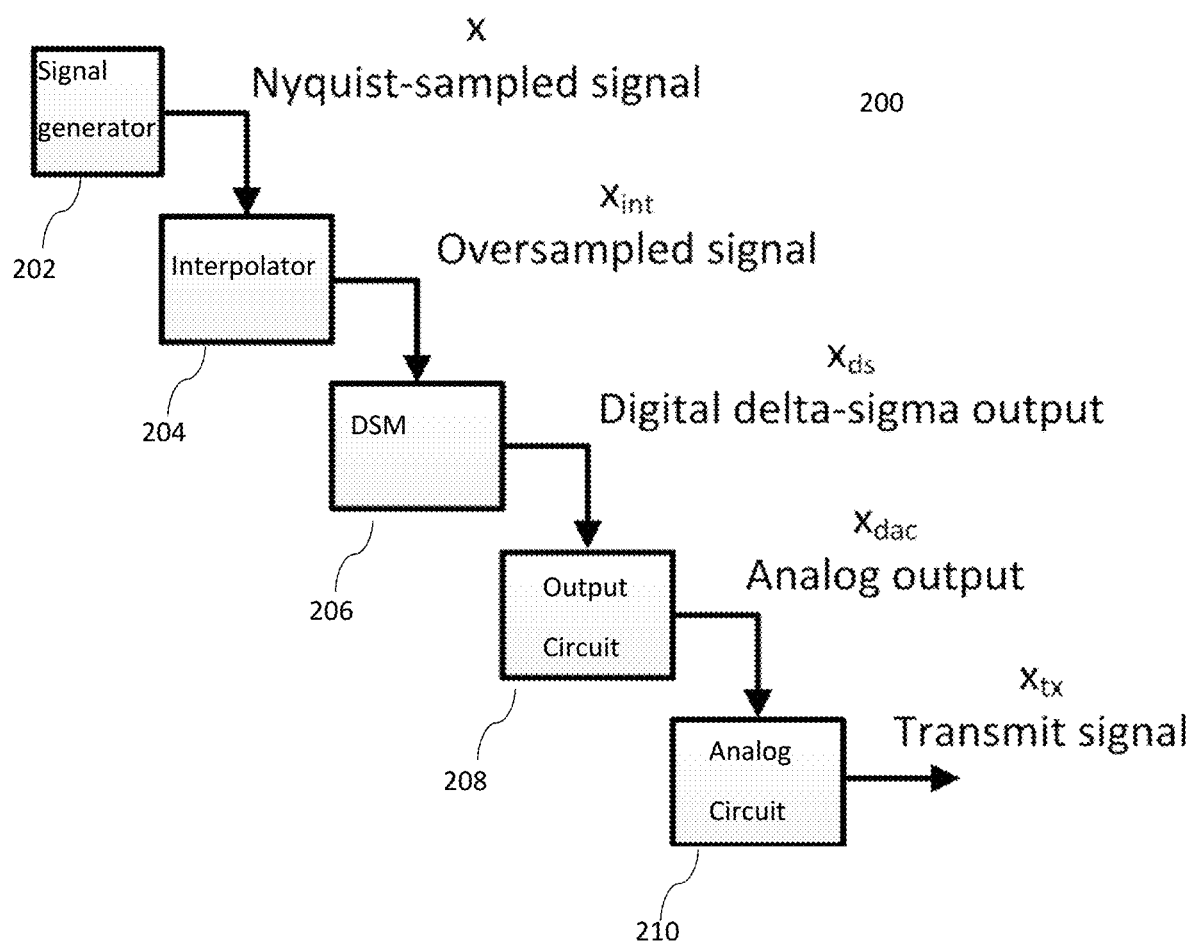
FIG. 2 is a block diagram of an exemplary transmit path of a radio frequency (RF) system, according to some embodiments of the disclosed invention.

FIG. 2 is a block diagram of an exemplary transmit path of a digital system for radio frequency (RF) transmission, according to some embodiments of the disclosed invention. As shown, a signal generator 202 generates a Nyquist-sampled (not highly-oversampled) baseband signal x. A digital interpolator 204 interpolates the baseband signal and generates an oversampled signal $x_{int}$ at a higher sampling rate, which is input to a non-recursive DSM 206. As the baseband signal x is Nyquist-sampled, the interpolation factor of the digital interpolator 204 is equal to the oversampling ratio. The oversampled signal $x_{int}$ is input to the non-recursive DSM 206. The output of the non-recursive DSM 206 ($x_{ds}$) is then converted to the analog domain by output circuit 208 to generate analog signal $x_{DAC}$. Further analog processing and filtering is performed on $x_{DAC}$ by analog circuitry 210 before it is transmitted as a transmit signal $x_{tx}$.

In some embodiments, the direct computation of residue receives a Nyquist-sampled (not highly oversampled) input signal instead of the oversampled signal, in which case $x=x_{int}$ and resource usage may be reduced by bypassing the preceding interpolation stage 204. In these embodiments, the interpolation operation may be performed by the same logic that performs the delta-sigma modulation and non-recursive computation of residues.

For some embodiments, the baseband signal x is a complex baseband representation of a higher-frequency signal, in which case frequency conversion/mixing may be performed as part of or subsequent to interpolation 204. In some embodiments, the interpolation 204 and mixing (if applicable) may be performed within the recursive DSM 206 for reduced overall resource utilization.

In some embodiments, the non-recursive computation of residues leverages knowledge of the band-limited nature of the interpolated input signal, the Nyquist-sampled signal x, the up-sampling factor M, the low-pass interpolation filter h, and the DSM transfer function g to calculate the residues. In some embodiments, the residues are calculated at specific intervals (e.g. at the baseband signal sample rate).

In some embodiments, the output circuit 208 is a component of the transmit path of a digital transceiver, which may be implemented in an integrated circuit (IC) or field-programmable gate array (FPGA).

Figure 3:
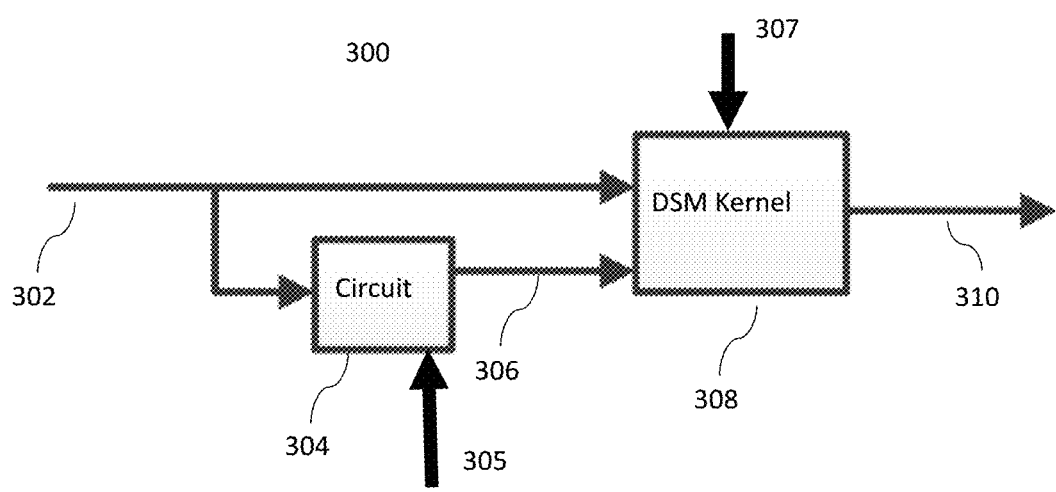
FIG. 3 is a simplified block diagram of an exemplary non-recursive delta-sigma modulator, according to some embodiments of the disclosed invention.

FIG. 3 is a simplified block diagram of an exemplary DSM 300 with non-recursive (direct) calculation of the delta-sigma residues, according to some embodiments of the disclosed invention. As shown, an oversampled signal $x_{int}$ 302 is input to a circuit 304 for direct computation of the residues. The oversampled signal $x_{int}$ 302 is also input to the DSM kernel 308, as are the directly-calculated residues 306 out of circuit 304. The DSM kernel 308 determines the delta-sigma output $x_{ds}$, 310.

Figure 4:
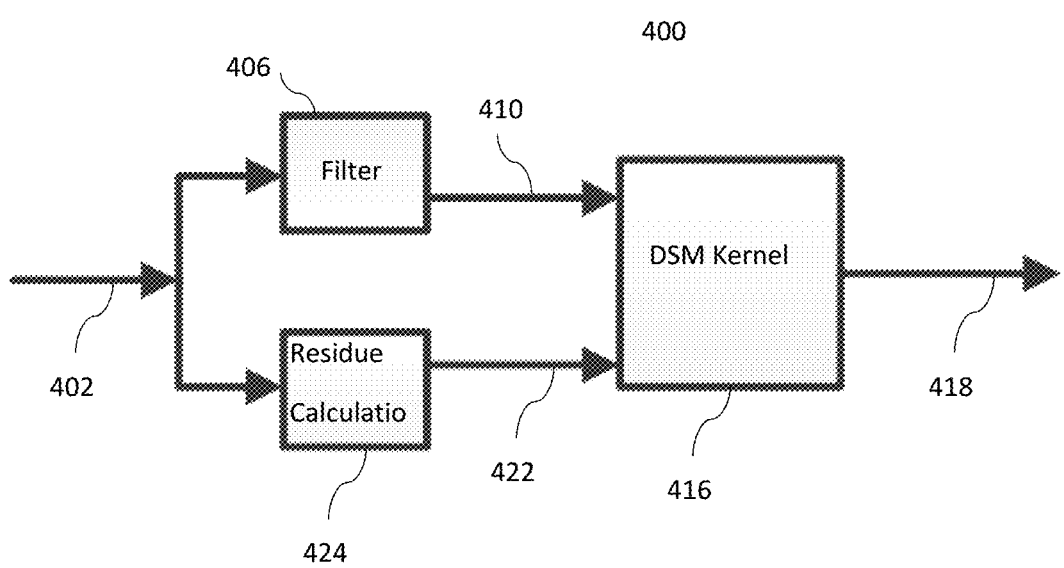
FIG. 4 is a simplified block diagram of an exemplary non-recursive delta-sigma modulator incorporating signal interpolation, according to some embodiments of the disclosed invention.

FIG. 4 is a block diagram of an exemplary DSM with non-recursive residue computation, according to some embodiments of the disclosed invention. In these embodiments, an interpolation operation is included in the DSM. As shown, a digital Nyquist-sampled baseband input signal 402 is received by an input port. The baseband input signal 402 is fed to an interpolation filter 406, such as a finite impulse response (FIR) interpolation filter, which interpolates the baseband input signal 402 by an interpolation factor M to produce the oversampled signal 410. The baseband input signal 402 is also input to a residue calculation circuit 424 that calculates the residues 422 non-recursively, for example in the case of a low-pass DSM, using an accumulation filter with knowledge of the interpolation filter 406 as described later in Eq. 19 and 20. In some embodiments, the accumulation filter includes an interpolator and a digital mixer to interpolate and mix the baseband input signal 402 to the desired output sample rate and frequency. The non-recursively computed residues 422 and the oversampled signal 410 are then fed to a DSM kernel 416 to produce the delta-sigma output 418.

Figure 5:
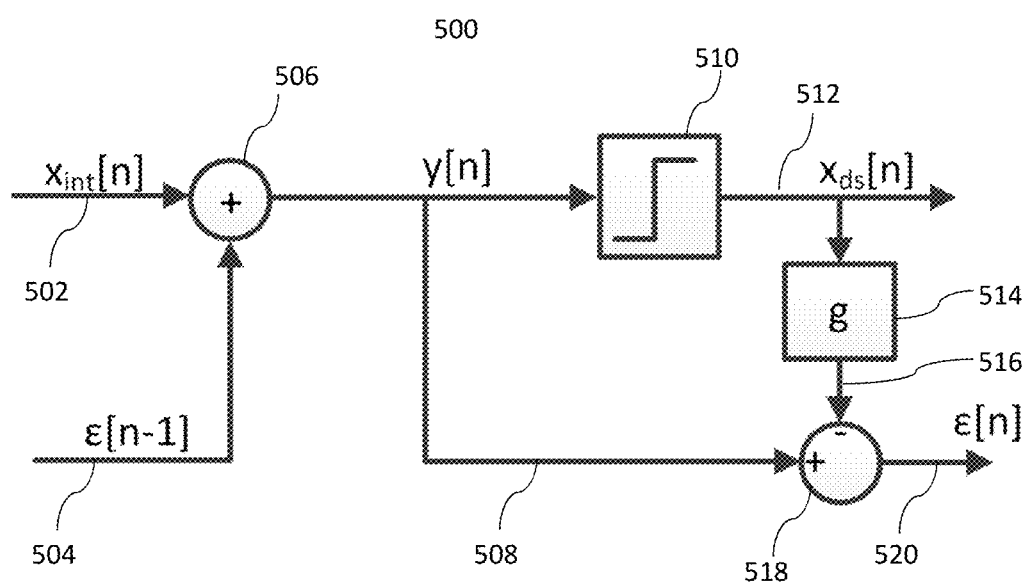
FIG. 5 is a block diagram of an exemplary delta-sigma modulator kernel, according to some embodiments of the disclosed invention.

FIG. 5 is a simplified block diagram of an exemplary delta-sigma modulator kernel for a low-pass DSM 500. As shown, a multi-bit oversampled signal $x_{int}[n]$ 502 is input to the low-pass DSM 500. The input signal is combined with a residue (error) signal $\varepsilon[n-1]$ 504 by an addition circuit 506 to produce an error-compensated signal y[n] 508. Signal 508 is quantized to 1 bit using a compare-to-zero comparator 510 to generate a modulated output signal $x_{ds}[n]$ 512. Signal 512 is then output from the low-pass DSM 500. Signal 512 is also fed to a decoder 514. Decoder 514 interprets the encoding of the output signal 512 to an appropriate scale and offset relative to the error-compensated signal 508. For some embodiments (e.g. 1-bit low-pass DSM), decoder 514 outputs a value of g when signal 364 has a value of "1" and a value of negative g when signal 364 has a value of "0" similar to the function of switch 116. The output of the decoder is combined with the error-compensated signal 508 by a second adder 518 to produce the 0-delay residue $\varepsilon[n]$ 520. When used in recursive logic, this residue 366 is used as input 354 of another delta-sigma kernel instance. In the case that the DSM kernel is non-recursive, the residue input 504 is computed previously, and blocks 514, 518, and output 520 are not needed.

The non-recursive implementation of both the residue computation and the DSM kernel enables pipelining for timing closure and parallelization for an output sample rate that is potentially much higher than the logic clock rate. Parallelization of the DSM kernel specifically could be achieved by including in the design multiple instances of the DSM kernel, each of which are fed a single sample of $x_{int}$ and the corresponding residue value. The level of abstraction in FIGS. 2, 3, and 4 is such that the samples of each of the represented signals could be serial (one sample per clock period) for some embodiments or parallel (multiple samples per clock period) for some embodiments. Parallel (or vector) sets of sample data drive the parallelization of the logic which produces and consumes it. The parallelization factor is related to the signal sampling rate and the logic clock rate.

For example, in some embodiments the baseband signal 402 has a sampling rate of 1 GHz but the logic clock is only 125 MHz. A baseband signal parallelization factor of N=8 passes 8 samples of signal 402 every clock cycle. Signal 402 is interpolated by interpolator 406 by a factor of M=10, resulting in an interpolated signal 410 of 10 GHz sampling rate. Assuming a common logic clock frequency, the interpolated signal 410 will have a parallelization of M×N=80 samples per clock cycle, where all the logic is running at a moderate 125 MHz clock rate—compared to an unachievable 10 GHz clock rate required to achieve equivalent performance from a fully-recursive DSM. Interpolated signal 410 is then input to the DSM kernel, which in this case has been parallelized by M×N=80—the output 418 of which is also parallelized.

Figure 6:
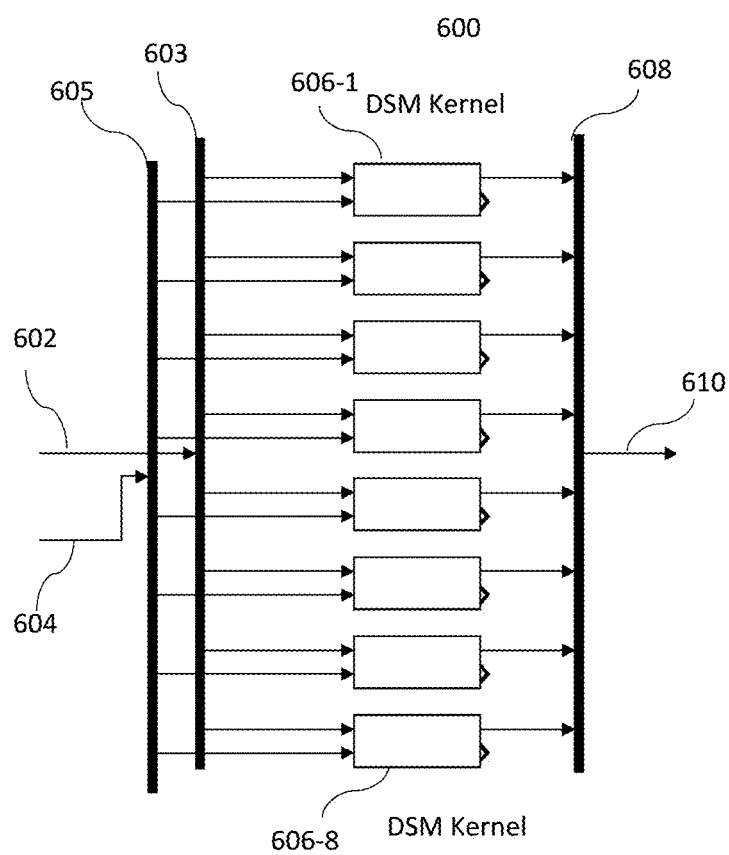
FIG. 6 is a block diagram of a parallelized block-recursive delta-sigma modulator kernel, according to some embodiments of the disclosed invention.

FIG. 6 depicts an exemplary embodiment of a parallelized DSM kernel 600, according to some embodiments of the disclosed invention. The parallelized DSM kernel 600 (similar to the DSM output calculation circuit 416 in FIG. 4) comprises multiple DSM kernel instances 606. As shown, a parallelized (vectorized) interpolated signal 602 (for example, based on signal 410 in FIG. 4) and vectorized non-recursive residues 604 (for example, based on residues 422 in FIG. 4) are parallelized per the desired number of non-recursive residue values provided in each clock cycle, for example, eight in the embodiments shown. Vector demultiplexers 603 and 605 output elements or sets of elements of the vectorized input signals 602 and 604, respectively. Vector multiplexer 608 vectorizes the delta-sigma output from DSM kernels 606 to produce a parallelized sigma-delta output signal 610. In some embodiments, vector multiplexer 608 and vector demultiplexers 603 and 605 are virtual operators intended to improve graphical depiction, and do not necessarily correspond to physical constructs.

In some embodiments, all delta-sigma residues are computed non-recursively, in which case the parallelization of FIG. 6 would correspond to M×N, which is also the parallelization factor of the DSM output $x_b$. In some embodiments, each DSM kernel instance 606-$i$ produces one sample of delta-sigma output using one sample of residue and one sample of the interpolated signal per clock cycle using the method described in Equations 2 and 3.

Figure 7:
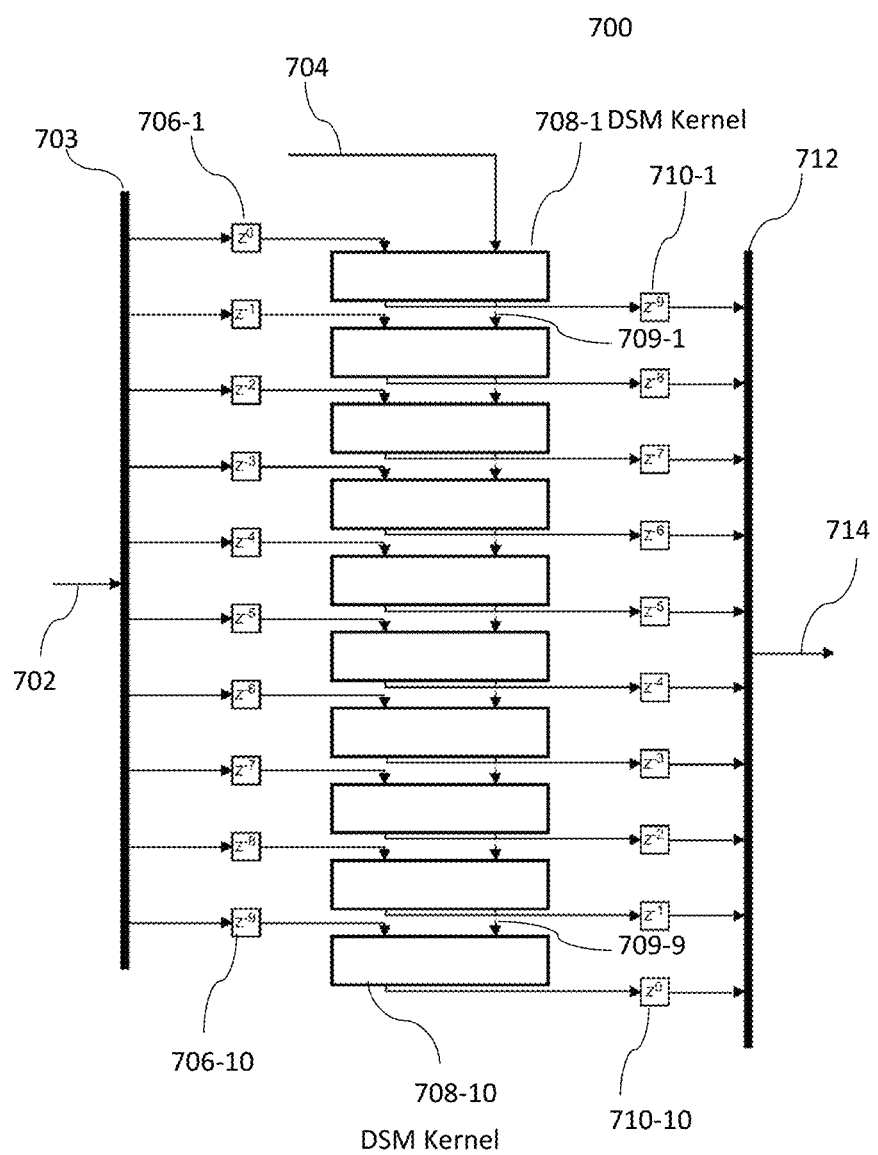
FIG. 7 is a block diagram of a pipelined block-recursive delta-sigma modulator kernel, according to some embodiments of the disclosed invention.

In some embodiments, delta-sigma residues are computed non-recursively on a longer interval (e.g. periodic) basis. FIG. 7 depicts an exemplary embodiment of a pipelined DSM kernel 700. Similar to the parallelized DSM kernel (DSM output calculation circuit) 600, the pipelined DSM kernel 700 comprises multiple DSM kernel instances 708 and receives a vectorized interpolated signal 702, with demultiplexer 703 and multiplexer 712 performing similar functions to 603 and 608, respectively. In contrast to the parallelized DSM kernel 600, the pipelined kernel 700 receives only one non-recursive residue 704 per clock cycle, which is input to the first DSM kernel 708-1. The first DSM kernel 708-1 also receives a sample of the vectorized interpolated signal 702 to produce a sample DSM output 714 and an output residue signal 709-1. The output residue 709-$i$ from DSM kernel 708-$i$ is also the input residue for DSM kernel 708-($i$+1).

In some embodiments, pipelining stages are added between DSM kernels 708 in order to meet logic timing requirements. Pipelining introduces a time offset in the residues 709 and the corresponding samples of the DSM output 714 in the chain of DSM kernels 708 relative to the input samples 702 and between the samples of the DSM output signal 714, which can be compensated for using a set of delays 706 and 710 on the samples of the vectorized interpolated signal 702 and DSM output signal 714, respectively. Input delays 706 and output delays 710 properly align the input and output data to the pipelined residues, with shorter delays at the beginning of the chain for the input 706 and longer delays at the beginning of the chain for the output 710. For example, in some embodiments which have pipelining which introduces an added residue delay of one clock cycle per 708-$i$, delay element 706-($i$+1) introduces a delay of one clock cycle more than the delay element 706-$i$. Conversely, each delay element 710-($i$+1) introduces a delay of one clock cycle less than the delay element 706-$i$.

In some embodiments, both parallelization and pipelining are used. For example, in some embodiments each 606 in the parallelized DSM kernel 600 is a pipelined DSM kernel 700, the interpolated input signal of which is vectorized and the residue input signal of which is not vectorized.

With the use of parallelization and pipelining of operations enabled by the non-recursive computation of DSM residues, such as those described above, the disclosed invention is capable of achieving arbitrarily-high output sample rates. The increase in the DSM output sample rate enables higher performance in the form of wider bandwidth and improved dynamic range of output signals.

The non-recursive DSM representation can be derived using an ordinary difference equation (ODE) model to represent a portion of the DSM. The particular solution $y_p$ of the ODE is derived using well-established ODE methods. The delta-sigma residue is then identically determined from $y_p$.

Figure 1:
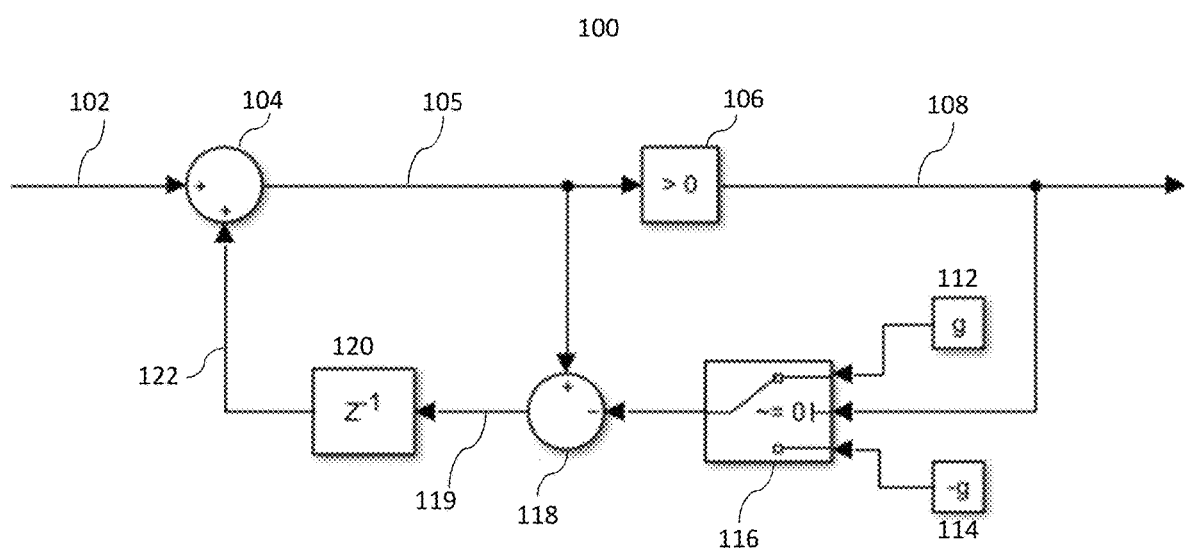
FIG. 1 is a simplified block diagram of a conventional fully-recursive first-order low-pass delta-sigma DAC.

The circuit depicted in FIG. 1 and the corresponding Equations 2 and 4 describe an ODE if the DSM gain g is 0. Equation 4 becomes $$\varepsilon'[n] = y_p[n] \tag{5}$$

Equation 2 becomes $$y_p[n] = -x_{int}[n] + \varepsilon'[n-1] \tag{6}$$
$$= -x_{int}[n] + y_p[n-1]$$

which is the recursive form of the ODE, where
n time index
$x_{int}[n]$ oversampled signal
$y_p[n]$ ODE particular solution
$\varepsilon'[n]$ ODE particular solution The signal $\varepsilon'[n]$ and $y_p[n]$ are now equivalent, representing the solution to the ODE relationship for a particular $x_{int}[n]$. They differ from $\varepsilon[n]$ and $y[n]$ in the original set of equations since their relationship no longer includes the feedback from switch 116 and addition circuit 118 of FIG. 1; however, $y_p[n]$ is directly related to $\varepsilon[n]$, e.g. as described later, in Equation 22.

The particular solution $y_p$ of the ODE for a first-order low-pass DSM can be easily inferred without use of ODE methods. The direct form of a particular solution $y_p[n]$ for $n \geq 0$ for input $x_{int}[n]$ is $$y_p[n] = y_p[0] + \sum_{n'=0}^{n-1} x_{int}[n'] \tag{7}$$

This solution can be verified by substitution into the recursive expression.

The solution can also be determined using ODE methods. For ODE forcing function $f[n]$, Equation 6 can be re-written in ODE form $$f[n] = -x_{int}[n-1] \tag{8}$$
$$= -y_p[n] + y_p[n-1]$$

First is the homogeneous solution $y_h$ of $$f[n] = -x_{int}[n] = 0 \tag{9}$$

which can be shown to be $$y_h[n] = C \tag{10}$$

The constant C can be determined for the unit impulse response (UIR) solution, with boundary conditions $$y_{UIR}[n] = \begin{Bmatrix} 0, & n < 0 \\ C, & n \geq 0 \end{Bmatrix} \tag{11}$$

and forcing function $\partial[n]$, the discrete unit impulse response, $$f[n] = \partial[n] = \begin{Bmatrix} 1, & n = 0 \\ 0, & n \neq 0 \end{Bmatrix} \tag{12}$$

which results in $$y_{UIR}[n] = \begin{Bmatrix} 0, & n < 0 \\ 1, & n \geq 0 \end{Bmatrix} = u[n], \quad (13)$$

u[n] being the unit step or accumulation function.

The particular solution $y_p$ for some causal $x_{int}$ is the convolution (*) of the UIR solution and $x_{int}$, resulting in the same solution for previously determined, with $y_p[0]=0$ resulting from the specific boundary conditions.

$$y_p[n] = y_{UIR}[n] * x_{int}[n] \quad (14)$$

$$= u[n] * x_{int}[n] \quad (15)$$

$$= \sum_{n'=0}^{n-1} x_{int}[n']$$

The particular solution $y_p$ to the ODE is closely related to the delta-sigma residue $\varepsilon$. For convenience, we define $$\bar{x}_b[n] = 1 - x_b[n] \quad (16)$$

$$= \begin{cases} 1, & y[n] \leq 0 \\ 0, & \text{otherwise} \end{cases}$$

which allows us to write Equation 4 as:

$$\varepsilon[n] = y[n] + g - 2g x_b[n] \quad (17)$$

$$= y[n] + 2g\bar{x}_b[n] - g$$

Assuming the modulator is not being driven to saturation, i.e.

$$|y[n]| = |x_{int}[n] + \varepsilon[n-1]| < 2g, \quad (18)$$

it follows that $$\varepsilon[n] = y[n] + 2g\bar{x}_b[n] - g \quad (19)$$

$$= y[n]\%(2g) - g$$

$$= (x_{int}[n] + \varepsilon[n-1])\%(2g) - g$$

where % is the modulus operator. Using recursive substitution:

$$\varepsilon[n] = (x_{int}[n] + \varepsilon[n-1])\%(2g) - g \quad (20)$$

$$= (x_{int}[n] + (x_{int}[n-1] + \varepsilon[n-2])\%(2g) - g)\%(2g) - g$$

$$= (x_{int}[n] + x_{int}[n-1] + \varepsilon[n-2] - g)\%(2g) - g$$

$$= (x_{int}[n] + x_{int}[n-1] + \varepsilon[n-2] + g)\%(2g) - g$$

and by extension $$\varepsilon[n] = \left( \sum_{n'=n_0}^{n} x_{int}[n'] + \varepsilon[n_0 - 1] + g(n - n_0) \right) \%(2g) - g. \quad (21)$$

Letting $n_0 = 0$ and $\varepsilon[n_0 - 1] = \varepsilon[-1] = 0$, $$\varepsilon[n] = \left( \sum_{n'=0}^{n} x_{int}[n'] + gn \right) \%(2g) - g \quad (22a)$$

$$= (y_p[n] + gn)\%(2g) - g \quad (22b)$$

where $y_p$ is, again, the particular solution of the associated ODE. Thus, the recursive component (e.g. $x_{int}[n]+\varepsilon[n-1]$) of the equation for DSM residues $\varepsilon[n]$ can be replaced by a non-recursive (direct) equivalent (e.g. $\Sigma_{n'=0}^{n} x_{int}[n']+gn$), which comprises an accumulation of the DSM input signal over time and an arithmetic offset g relative to the time index, the specific example being for a low-pass DSM.

In some embodiments, the DSM output $x_{ds}$ is determined from the non-recursive residues by the method described in Equations 2 and 3. In other words, the output of a first-order low-pass DSM $x_{ds}$ is 1 if the sum of the corresponding sample of DSM residue and the corresponding sample of the interpolated signal $x_{int}$ is greater than 0.

In some embodiments, each residue is calculated directly. In other embodiments, residues are calculated directly at a desired "decimated" interval (for example, every M output samples, or at the same rate as the un-interpolated input signal x), and the remainder are calculated recursively using blocks of recursive DSM logic, which can be parallelized and pipelined (e.g. as depicted FIG. 7).

In some embodiments, for M of even parity, Equation 22 becomes $$\varepsilon[Mn] = \left( \sum_{n'=0}^{n-N} x[n'] + \sum_{n'=0}^{\frac{N}{M}-1} x[n-n']h'[Mn'] \right) \%(2g) - g, \quad (23)$$

$$h'[n'] = \sum_{n''=0}^{n'} h[n''] \quad (24)$$

where h is the interpolation filter of length N relating x to $x_{int}$.

These derivations establish the feasibility of non-recursively calculating residues. The signal $y_p$ can be calculated using any one of a multiplicity of approaches. In general, multiple samples of the signal $y_p$ are calculated per clock period to enable the DSM output sample rate to be higher than the logic clock rate.

Figure 8:
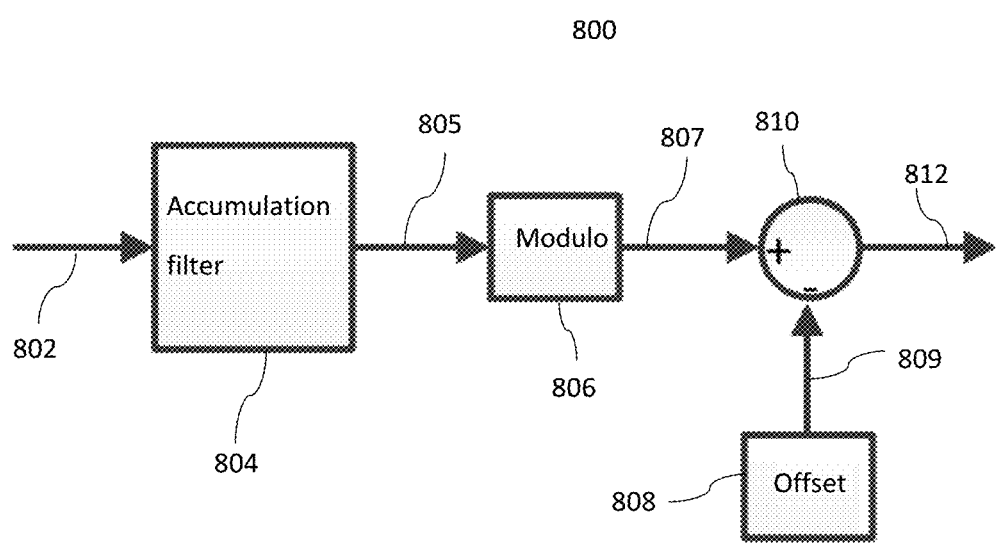
FIG. 8 is a block diagram of an exemplary non-recursive residue even-parity M-periodic calculation circuit, according to some embodiments of the disclosed invention.

FIG. 8 is a block diagram of an exemplary non-recursive residue calculation circuit, according to some embodiments of the disclosed invention. The non-recursive residue calculation circuit calculates DSM residues (e.g. by the method described in Equation 23 for low-pass DSM) particularly for an even-parity M-periodic calculation of residues. As shown, an input signal x 802 (for example, based on signal 302 in FIG. 3), is accumulated over time by an accumulation filter 804. The output 805 of the accumulator is passed through a modulo circuit 806, which provides a non-recursive model for the effect of the feedback from switch 116 in the fully-recursive DSM. The DSM gain g 809 from gain offset circuit 808 is subtracted from output 807 of modulo circuit 806 by a subtracting circuit 810 to generate the non-recursive residue output 812, which can then be used in generating the DSM output.

Figure 9:
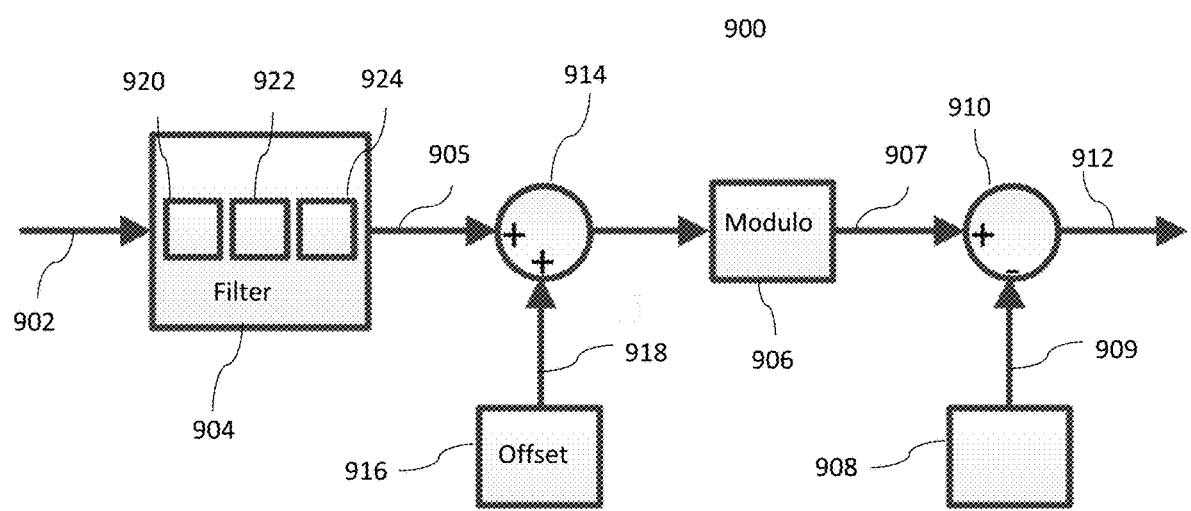
FIG. 9 is a block diagram of an exemplary non-recursive residue generic-parity M-periodic calculation circuit, according to some embodiments of the disclosed invention.

FIG. 9 is a block diagram of an exemplary non-recursive residue calculation circuit, according to some embodiments of the disclosed invention. These embodiments have substantial similarities with those depicted in FIG. 8, but are applicable for generic parity M-periodic calculation of residues (per Equation 21 for a low-pass DSM). The input signal 902 (for example, based on signal 402 in FIG. 4) is filtered by filter circuit 904 to generate filtered signal 905. The addition circuit 914 adds the DSM gain to predetermined samples of 905 according to signal 918 from gain offset circuit 916, based on the time index of each sample and according to Eq. 22. The output of addition circuit 914 is passed to modulo circuit 906, whose output 907 is passed to a subtraction circuit 910. The subtraction circuit 910 subtracts the DSM gain 909 produced by 908 from 907 to generate a non-recursive delta-sigma residue output 912.

In some embodiments, the filter 904 includes an interpolator 920, a digital mixer 922, and an accumulation filter 924 to interpolate, mix, and accumulate the baseband input signal 402 to produce the output 905 at the desired output sample rate and frequency. In some embodiments (e.g. band-pass DSM), the accumulation filter 924 is a poly-phase accumulator, the predetermined number of phases relating to the desired signal output frequency.

The following are defined as:

M, The interpolation factor relating x to $x_{int}$
h, The interpolation filter relating x to $x_{int}$
N, The parallelization factor of the input data x
M×N, The parallelization factor of the output data $x_b$ Here, M is equivalently the number of $x_{int}$ samples per number of x samples, N is equivalently the ratio between the input data rate and the logic clock rate, and M×N is equivalently the ratio between the output data rate and the logic clock rate.

In some embodiments, $y_p$ is calculated using recursive components, the recursive cycle of which are less than or equal to the logic clock rate. For example, there are M×N samples of signal $x_{int}$ per logic clock cycle. Mutually exclusive sets of M×N adjacent samples of $x_{int}$ can be summed non-recursively, the recursive accumulation of which occurs at a rate equal to the logic clock rate. The recursive accumulation represents $y_p[MNn]$, or in words, $y_p$ at an interval of M×N samples. The other samples (i.e. $y_p[MNn+m]$) can be computed by summing $y_p[MNn]$ with the sum of $x_{int}[MNn+1]$ through $x_{int}[MNn+m]$ by one of many possible methods.

In some embodiments, the calculation of $y_p$ is made more efficient by recognizing that $x_{int}$ is an interpolation (contains no new information) of x. As a variation of the previously mentioned embodiments, sets of N adjacent samples of x can be summed more efficiently than M×N samples of $x_{int}$. This and various other embodiments using x instead of $x_{int}$ as an input can produce mathematically equivalent results as long as the effects of the interpolation filter h are considered.

In some embodiments, $y_p$ is not itself an output from the DSM and a related signal $y_p'$ is substituted with substantially equivalent DSM performance. For example, the use of $y_p'[n]=(y_p[n])\%(2g)$ in place of $y_p$ may reduce the signal bit-width and therefore the required resources, and the DSM would have an identical output.

In some embodiments, the modulo circuit makes the DSM more resource efficient with the appropriate selection of the delta-sigma feedback gain. For example, the accumulator data type may be selected so that the data rolls over at the modulus value 2 g of the modulo operator (e.g. an unsigned 8-bit accumulator with roll-over, and 2 g being substantially equivalent to $2^8=256$ times the value of the least-significant bit). Relative to an accumulator with data type of sufficient bits to represent the accumulation without saturation or wrapping, this maintains identical performance while significantly reducing the logic resource utilization of the accumulator.

In some embodiments, each delta-sigma residue is computed and used to determine the DSM output without the use of the interpolated signal. These embodiments may have improved resource utilization. Note that the combination of Equations 3, 4a, and 18 warrant that a first-order low-pass DSM output $x_{ds}$ value of 1 corresponds to a decreasing residue value ε. It follows that the DSM residue is decreasing, the DSM output is 1. Mathematically:

$$x_{ds}[n] = \begin{cases} 1 & \varepsilon[n]-\varepsilon[n-1] < 0 \\ 0 & \varepsilon[n]-\varepsilon[n-1] \geq 0 \end{cases} \quad (25)$$

While this is specifically for a first-order low-pass DSM, similar relationships exist for other embodiments.

In some embodiments, DSM output calculation circuit generates the output of the DSM using a comparison of DSM residue samples over time (for example in the case of a first-order low-pass DSM by differencing time-adjacent residues and comparing the result to zero, as described in Equation 25). In these embodiments, the DSM output calculation circuit replaces the DSM kernel 308 and 416 in FIG. 3 and FIG. 4, respectively, and the input 302 into 308, the input 410 into 416, and the interpolator 406 are not required.

Each of these approaches represent variations on the method or system for non-recursive calculation of residues. In some embodiments, the DSM is used in a delta-sigma DAC. The specific equations presented above describe exemplary logic/circuits for some embodiments of the disclosed invention, however, the method and system of the disclosed invention is not limited to the exemplary logic/circuits. Moreover, pipelining delays may be added along any of the logic paths for timing purposes, so long as the relative delay to the signals with which they are combined is correct. The block recursive DSM DAC of the disclosed invention may be used for a variety of applications and improves several different technologies. For example, it can be used with and improve analog filtering, radar systems, communication systems, electronic warfare, low-power or ad-hoc computer networks, unmanned aerial vehicles (UAVs), medical equipment, driverless automobiles, and the like.

In some embodiments, the DSM output may pass through analog processing such as filtering, mixing, and amplification before being transmitted through a wired, wireless, or optical medium. In some embodiments, the analog filtering passband includes the operational frequency range of the DSM. In some embodiments, the DSM output may be stored or transmitted digitally and then processed digitally to recover an approximation of the signal x.

Although delta-sigma modulation is often applied to 1-bit quantizers, such as 418 of FIG. 4, to improve dynamic range performance, multi-bit quantizers also benefit from the non-recursive DSM of the disclosed invention. For instance, if the multi-bit low pass (LP) DSM quantizer resolution is equal to the 1-bit LPDSM gain factor, much of the 1-bit LPDSM can be reused. In some embodiments of the disclosed invention, the non-recursive DSM residues are identical for both a 1-bit and a multi-bit DSM output, where the dynamic range (e.g., maximum absolute value without saturation) of the input and output is increased, which improves performance with a minimal increase in processing overhead.

In some embodiments of a multi-bit DSM, the disclosed invention may bond high sample-rate (e.g., multiple Giga bits/per sample) transceivers for a multi-bit output, where bits can be binary scaled internally or externally. For example, a FPGA may include a plurality of high-speed serial data transceivers, each including a high-speed transmitter configured to transmit serial data at high data rates (e.g., data rates exceeding 20 Gb/s). The FPGA may include, for instance, many transceivers capable of operating at serial data rates of 28 Gigabits per second or more. Each such transmitter may include an output drive circuit connected to an output pin of the FPGA. The output drive circuit may have a programmable output voltage swing, e.g., a voltage swing that may be programmed by setting a register in the FPGA.

Two or more transmitter outputs may be configured to generate signals with different voltage swings, and the outputs may be combined, e.g., with a power combiner. A more detailed approach of generating analog outputs from an FPGA by combining scaled digital outputs is described in the co-owned U.S. patent Ser. No. 10/284,202, entitled "Generating Analog Output From A Field Programmable Gate Array By Combining Scaled Digital Outputs," the entire contents of which is expressly incorporated by reference herein.

In some embodiments, the input baseband signal is purely real.

In some embodiments of the invention, the input x is a complex baseband signal intended for transmit at a fraction of the DSM output sample rate. In these embodiments, a derivation similar to that performed for the low-pass DSM, except for a second-order band-pass DSM, provides the method and operations required for non-recursive computation of DSM residues.

It will be recognized by those skilled in the art that various modifications may be made to the illustrated and other embodiments of the invention described above, without departing from the broad inventive scope thereof. It will be understood therefore that the invention is not limited to the particular embodiments or arrangements disclosed, but is rather intended to cover any changes, adaptations or modifications which are within the scope and spirit of the invention as defined by the appended claims and drawings.

The invention claimed is:

1. A delta-sigma modulator (DSM) with non-recursive computation of delta-sigma residues comprising:
an input port for receiving a digital input signal;
a residue calculation circuit coupled to the input port for calculating delta-sigma residues non-recursively; and
a DSM output calculation circuit coupled to the output of the residue calculation circuit for generating an output of the DSM, wherein the residue calculation circuit comprises an accumulation filter coupled to the input port for accumulating the digital input signal, a modulo operator coupled to the accumulator, and a subtracting circuit for subtracting a DSM gain from predetermined samples of an output of modulo operator to generate a non-recursive delta-sigma residue output.

2. The DSM of claim 1, wherein the accumulation filter comprises an interpolator and a digital mixer to interpolate and mix the digital input signal to a desired output sample rate and frequency.

3. The DSM of claim 1, wherein the accumulation filter is a poly-phase accumulator, the predetermined number of phases relating to the desired signal output frequency.

4. The DSM of claim 1, wherein the output calculation circuit generates the output of the DSM using a comparison of DSM residue samples over time.

5. The DSM of claim 1, wherein the delta-sigma residues and DSM output are parallelized per a predetermined number of delta-sigma residue values provided in each clock cycle of the DSM.

6. A delta-sigma modulator (DSM) with non-recursive computation of delta-sigma residues comprising:
an input port for receiving a digital input signal;
a residue calculation circuit coupled to the input port for calculating delta-sigma residues non-recursively; and
a DSM output calculation circuit coupled to the output of the residue calculation circuit for generating an output of the DSM, wherein the residue calculation circuit calculates a portion of the delta-sigma residues directly and without recursion, and calculates another portion of the delta-sigma residues recursively.

7. The DSM of claim 1, wherein the residue calculation circuit calculates delta-sigma residues non-recursively for an M-periodic calculation of residues.

8. The DSM of claim 1, wherein the residue calculation circuit calculates delta-sigma residues non-recursively at a rate equal to a sampling rate of the digital input signal.

9. The DSM of claim 1, wherein the output of the DSM is in a one-bit format.

10. The DSM of claim 1, wherein the output of the DSM is in a multi-bit format.

11. A digital-to-analog converter (DAC) comprising a delta-sigma modulator (DSM) with non-recursive computation of delta-sigma residues, wherein the DSM comprises:
an input port for receiving a digital input signal;
a residue calculation circuit coupled to the input port for calculating delta-sigma residues non-recursively; and
a DSM output calculation circuit coupled to the output of the residue calculation circuit for generating an output of the DSM, wherein the residue calculation circuit comprises an accumulation filter coupled to the input port for accumulating the digital input signal, a modulo operator coupled to the accumulator, and a subtracting circuit for subtracting a DSM gain from predetermined samples of an output of modulo operator to generate a non-recursive delta-sigma residue output.

12. A method for non-recursive computation of delta-sigma residues, the method comprising:
receiving a digital input signal;
calculating delta-sigma residues non-recursively by calculating a portion of the delta-sigma residues directly and without recursion, and calculating another portion of the delta-sigma residues recursively; and
generating an output of the DSM.

13. The method of claim 12, further interpolating the digital input signal to produce an oversampled digital signal.

14. The method of claim 12, wherein the output of the DSM and the delta-sigma residues are parallelized per a predetermined number of delta-sigma residue values provided in each clock cycle of the DSM.

15. The method of claim 12, wherein calculating delta-sigma residues non-recursively is performed by a residue calculation circuit comprising an accumulator for accumulating the digital input signal, a modulo operator coupled to the accumulator, and a subtracting circuit for subtracting a DSM gain from an output of modulo operator to generate a non-recursive delta-sigma residue output.

16. The method of claim 12, wherein calculating delta-sigma residues non-recursively comprises calculating the delta-sigma residues directly at a desired decimated interval M, and calculating a remainder of the delta-sigma residues recursively using blocks of recursive DSM circuits, wherein M is an integer greater than one.

17. The method of claim 12, wherein the output of the DSM is in a one-bit format.

18. The method of claim 12, wherein the output of the DSM is in a multi-bit format.

* * * * *